United States Patent
Takemoto

(10) Patent No.: US 7,511,355 B2
(45) Date of Patent: Mar. 31, 2009

(54) SEMICONDUCTOR DEVICE HAVING FUSE ELEMENT

(75) Inventor: Hiroki Takemoto, Gifu (JP)

(73) Assignee: Sanyo Electric Co., Ltd. (JP)

( * ) Notice: Subject to any disclaimer, the term of this patent is extended or adjusted under 35 U.S.C. 154(b) by 32 days.

(21) Appl. No.: 11/523,890

(22) Filed: Sep. 20, 2006

(65) Prior Publication Data

US 2007/0063312 A1   Mar. 22, 2007

(30) Foreign Application Priority Data

Sep. 22, 2005   (JP)   ............... 2005-274908

(51) Int. Cl.
*H01L 23/62*   (2006.01)
(52) U.S. Cl. .............. 257/529; 257/355; 257/530
(58) Field of Classification Search ............ 257/355, 257/529, 530
See application file for complete search history.

(56) References Cited

U.S. PATENT DOCUMENTS 4,716,302 A * 12/1987 Flannagan et al. .......... 327/546

FOREIGN PATENT DOCUMENTS

JP          7-86517          3/1995

OTHER PUBLICATIONS

Notice to Submit Argument for Korean Application Serial No. 10-2006-91699 Mailed Aug. 3, 2007.

* cited by examiner

*Primary Examiner*—Douglas M Menz
(74) *Attorney, Agent, or Firm*—Cantor Colburn LLP

(57) ABSTRACT

In a semiconductor device including a switching element and a fuse element which is connected in series with the switching element and which melts and blows out as a result of an electric current flowing therethrough when the switching element is placed in an electrically conducting state, in which an electrostatic breakdown protection circuit for preventing electrostatic breakdown is connected to a control line which applies a control signal for controlling the switching element, the effect of electrostatic noise can be reduced.

3 Claims, 2 Drawing Sheets

SEMICONDUCTOR DEVICE HAVING FUSE ELEMENT

PRIORITY INFORMATION

This application claims priority to Japanese Patent Application No. 2005-274908, filed on Sep. 22, 2005, which is incorporated herein by reference in its entirety.

BACKGROUND OF THE INVENTION

1. Field of the Invention

The present invention relates to a semiconductor device having a fuse element in which melting or blowout caused by electrostatic noise is suppressed.

2. Description of Related Art

In a semiconductor device including an electrical circuit formed on a semiconductor substrate, a technique in which a fuse element is incorporated in a portion of the circuit so as to achieve fine adjustment of the circuit function after manufacturing the device has been used. For example, as shown in FIG. 4, in a structure in which a power source Vcc is connected via a fuse element 12 to an internal circuit 10, a control line 16 is extended toward an electrode 14 provided outside a semiconductor device from one end a of the fuse element 12 to which the power source Vcc is not connected.

If it is not necessary to apply the power source Vcc to the internal circuit 10, the electrode 14 is set to a negative voltage which allows an electric current of an intensity causing blowout of the fuse element 12 to flow in the fuse element 12, so that the fuse element 12 can melt or blow out to break the connection between the internal circuit 10 and the power source Vcc.

In the circuit structure shown in FIG. 4, however, there is a disadvantage that the fuse element 12 may blow out or melt regardless of whether or not it is necessary, when electrostatic noise of the negative voltage is applied for a certain reason to the electrode 14 provided outside the semiconductor device. Further, as the control line 16 is directly connected with the fuse element 12, it is not possible to provide an electrostatic breakdown protection circuit for electrostatic noise on the control line 16.

SUMMARY OF THE INVENTION

In one aspect of the present invention, there is provided a semiconductor device including an electrical circuit formed on a semiconductor substrate, comprising a switching element, and a fuse element which is connected in series with the switching element and which blows out as a result of an electric current flowing when the switching element is placed in an electrically conducting state, wherein an electrostatic breakdown protection circuit is connected to a control line for applying a control signal which controls the switching element.

BRIEF DESCRIPTION OF THE DRAWINGS

Preferred embodiments of the present invention will be described in detail based on the following figures, wherein.

DETAILED DESCRIPTION OF PREFERRED EMBODIMENTS

Figure 1:
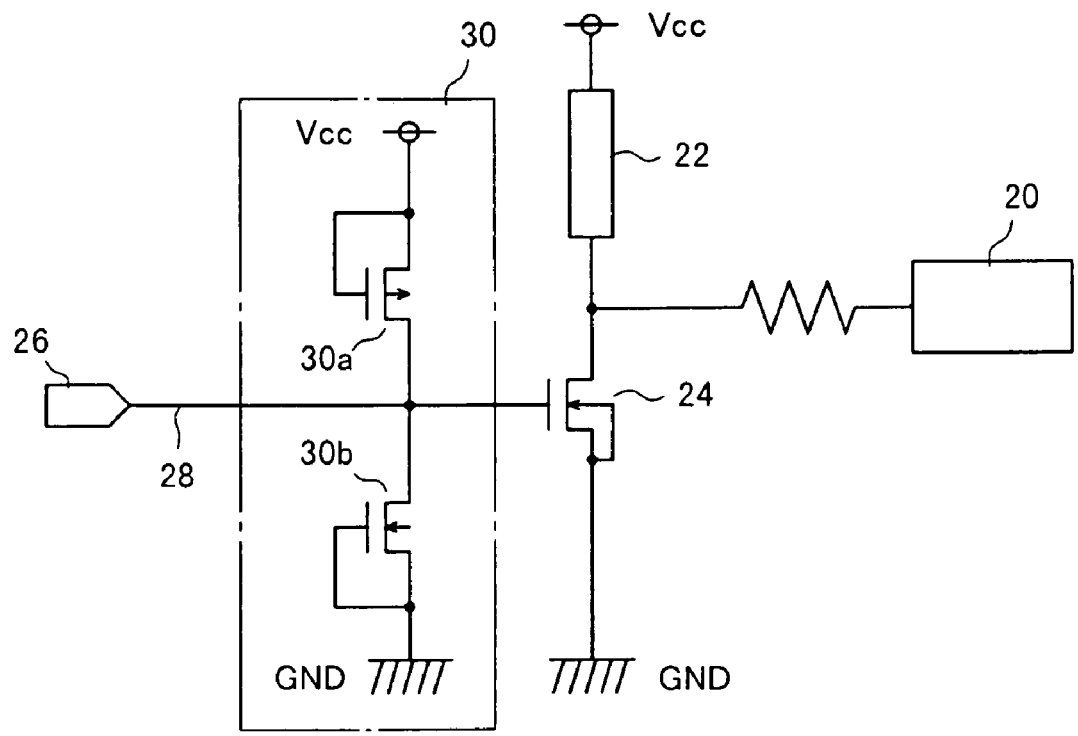
FIG. 1 is a circuit diagram showing a structure of a semiconductor device according to an embodiment of the present invention.

Preferred embodiments of the present invention will be described in detail with reference to the accompanying drawings.

A semiconductor device 100 according to an embodiment of the present invention is formed by including an internal circuit 20, a fuse element 22, a field effect transistor 24, an electrode 26, and an electrostatic breakdown protection circuit 30. The semiconductor device 100 is formed on a semiconductor substrate using planar technology or the like.

The fuse element 22 is disposed in a supply line of the power source Vcc to the internal circuit 20. The fuse element 22 blows out by application of a voltage exceeding a predetermined threshold value at both ends thereof to thereby break the connection between the internal circuit 20 and the power source Vcc. A first terminal of the fuse element 22 is connected to the power source Vcc and a second terminal of the fuse element 22 is connected via a resistor element R or the like to the internal circuit 20.

Figure 2:
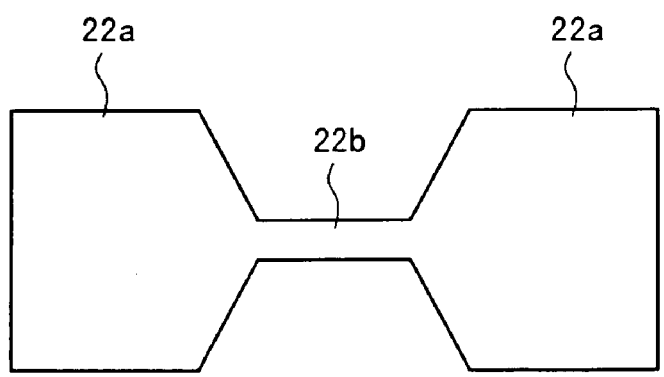
FIG. 2 is a plan view showing a structure of a fuse element according to the embodiment of the present invention.

The fuse element 22 is composed of a resistor element made of a poly silicon layer or the like which is formed on the semiconductor substrate. As shown in a plan view of FIG. 2, for example, the fuse element 22 is preferably formed by including a poly silicon layer having a large width portion 22a and a small width portion 22b. The resistance value of the fuse element 22 is adjusted by adjusting the cross sectional area and the length of the small width potion 22b. At the same time, the cross sectional area of the fuser element 22 is set such that the fuse element 22 melts and blows out when a predetermined electric current flows therethrough.

The field effect transistor 24 is used as a switching element having a high input impedance for controlling an electric current for melting the fuse element 22. In this example, the field effect transistor 24 is an N channel transistor. A drain of the field effect transistor 24 is connected to the second terminal of the fuse element 22 and a source of the field effect transistor 24 is grounded. Further, a gate of the field effect transistor 24 is connected through a control line 28 to the electrode 26.

The electrode 26 is provided for applying a control signal to the gate of the field effect transistor 24. The electrode 26 is externally exposed when the semiconductor device 100 is in a bare chip state, and a user can set the electrode 26 to a positive voltage with respect to the source to place the drain and the source of the field effect transistor 24 in an electrically conducting state and thus cause an electric current for melting the fuse element 22 to flow therethrough.

In the present embodiment, the electrostatic breakdown protection circuit 30 is provided on the control line 28. The electrostatic breakdown protection circuit 30 may be various circuits.

For example, as shown in FIG. 1, the electrostatic breakdown protection circuit 30 may include a first diode 30a having an anode connected to the control line 28 and a cathode connected to the power source Vcc and a second diode 30b having a cathode connected to the control line 28 and an anode being grounded. With this circuit, when the potential of the electrode 26 increases as a result of application of electrostatic noise to the electrode 26, the first diode 30a is placed in an electrically conducting state to allow the electrostatic noise to escape to the power source Vcc line, and when the potential of the electrode 26 decreases as a result of application of electrostatic noise to the electrode 26, the second diode 30b is placed in an electrically conducting state to allow the electrostatic noise to escape to the ground line. Thus, an effect caused by the electrostatic noise can be suppressed.

More specifically, the gate width and the gate length of the field effect transistor 24 are set to 1 μm or less and approximately several hundreds μm (e.g. 0.34 μm and 160 μm), respectively, and the fuse capacity of the fuse element 22 is set to several tens mW (e.g. 39 mW). By turning the field effect transistor 24 ON with a voltage of several volts (e.g. 2V) being applied thereto as the power source voltage Vcc, the fuse element 22 can blow.

Figure 3:
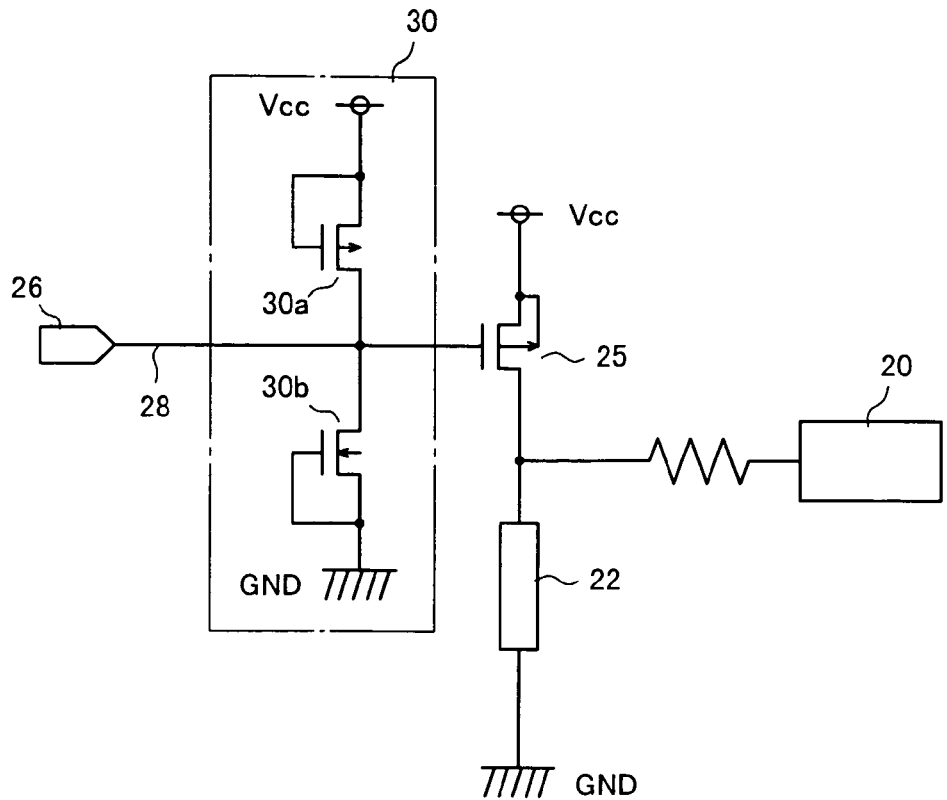
FIG. 3 is a circuit diagram showing another example structure of a semiconductor device according to a further embodiment of the present invention.
Figure 4:
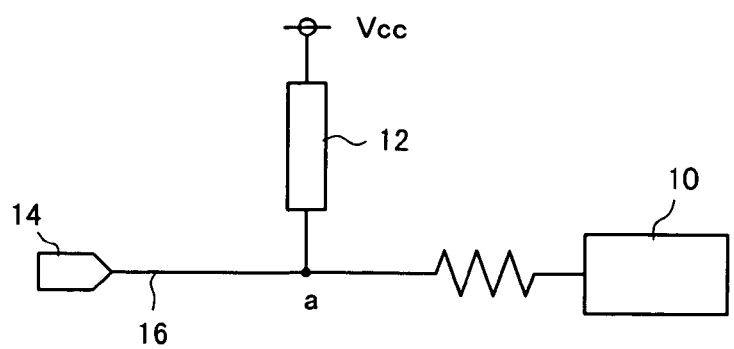
FIG. 4 is a circuit diagram showing a structure of a semiconductor device of the related art.

In another exemplary embodiment, a semiconductor device 102 may have a circuit structure shown in FIG. 3. Specifically, the semiconductor device 102 includes an internal circuit 20, a fuse element 22, a field effect transistor 25, an electrode 26, and an electrostatic breakdown protection circuit 30. The semiconductor device 102 is formed on a semiconductor substrate using planar technology or the like similar to the case of the semiconductor device 100.

In the semiconductor device 102, a first terminal of the fuse element 22 is connected via a resistor element R to the internal circuit 20 and a second terminal of the fuse element 22 is grounded. The fuse element 22 can be formed on the semiconductor substrate as with the fuse element 22 of the semiconductor device 100.

The field effect transistor 25 is used as a switching element having a high input impedance for controlling an electric current for melting the fuse element 22. In this example, the field effect transistor 25 is a P channel transistor. A drain of the field effect transistor 25 is connected to the power source Vcc and a source of the field effect transistor 25 is connected to the first terminal of the fuse element 22. Further, a gate of the field effect transistor 25 is connected through a control line 28 to the electrode 26 which applies a control signal to the gate of the field effect transistor 25 via the control line 28. A user can set the electrode 26 to a negative voltage with respect to the source to place the drain and the source of the field effect transistor 25 in an electrically conducting state and thus cause an electric current for melting the fuse element 22 to flow therethrough.

An electrostatic breakdown protection circuit 30 is provided on the control line 28. Similar to the electrostatic breakdown protection circuit in the semiconductor device 100, the electrostatic breakdown protection circuit 30 in this example may include a first diode 30a having an anode connected to the control line 28 and a cathode connected to the power source Vcc and a second diode 30b having a cathode connected to the control line 28 and an anode being grounded. With this circuit, when the potential of the electrode 26 increases as a result of application of electrostatic noise to the electrode 26, the first diode 30a can be placed in an electrically conducting state to cause the electrostatic noise to escape to the power source Vcc line, and when the potential of the electrode 26 decreases as a result of application of electrostatic noise to the electrode 26, the second diode 30b can be placed in an electrically conducting state to cause the electrostatic noise to escape to the ground line.

More specifically, the gate width and the gate length of the field effect transistor 25 are set to 1 μm or less and approximately several hundreds μm (e.g. 0.34 μm and 400 μm), respectively, and the fuse capacity of the fuse element 22 is set to several tens mW (e.g. 39 mW). By turning the field effect transistor 25 ON with a voltage of several volts (e.g. 2.1 V) being applied thereto as the power source voltage Vcc, the fuse element 22 can blow out.

As described above, in the semiconductor device according to the embodiments of the present invention, with a switching element which indirectly controls an electric current flowing in the fuse element being provided, it is possible to provide an electrostatic breakdown protection circuit on the control line of the switching element. Thus, it is possible to prevent the fuse element from unintentionally blowing out as a result of electrostatic noise.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device including an electrical circuit formed on a semiconductor substrate, comprising:
    a switching element; and
    a fuse element which is connected in series with the switching element and which blows out as a result if an electric current flowing therethrough when the switching element is placed in an electrically conducting state,
    wherein an electrostatic breakdown protection circuit is connected to a control line which applies a control signal for switching the switching element; and
    the electrostatic breakdown protection circuit comprises:
        a first diode having an anode connected to the control line and a cathode connected to a power source; and
        a second diode having a cathode connected to the control line and an anode being grounded.

2. The semiconductor device according to claim 1, wherein the switching element is an N channel field effect transistor, and
    one end of the fuse element is grounded via a drain and a source of the N channel field effect transistor, and the control line is connected to a gate terminal of the N channel field effect transistor.

3. The semiconductor device according to claim 1, wherein the switching element is a P channel field effect transistor, and
    one end of the fuse element is connected with a power source via a drain and a source of the P channel field effect transistor and the control line is connected to a gate terminal of the P channel field effect transistor.

* * * * *